US007109641B2

(12) United States Patent
Park

(10) Patent No.: US 7,109,641 B2
(45) Date of Patent: Sep. 19, 2006

(54) LOW VOLTAGE MICRO SWITCH

(75) Inventor: Jae Yeong Park, Seoul (KR)

(73) Assignee: LG Electronics Inc., Seoul (KR)

( * ) Notice: Subject to any disclaimer, the term of this patent is extended or adjusted under 35 U.S.C. 154(b) by 136 days.

(21) Appl. No.: 10/829,223

(22) Filed: Apr. 22, 2004

(65) Prior Publication Data

US 2004/0211654 A1 Oct. 28, 2004

(30) Foreign Application Priority Data

Apr. 25, 2003 (KR) ...................... 10-2003-0026466

(51) Int. Cl.
*H01L 41/08* (2006.01)

(52) U.S. Cl. ....................................... 310/330; 310/328

(58) Field of Classification Search ................ 310/328, 310/330

See application file for complete search history.

(56) References Cited

U.S. PATENT DOCUMENTS 6,153,839 A * 11/2000 Zavracky et al. ........... 200/181
6,373,007 B1 * 4/2002 Calcatera et al. ........... 200/181
6,377,438 B1 * 4/2002 Deane et al. ............... 361/278
6,765,300 B1 * 7/2004 Wagenaar et al. .......... 257/780
2002/0109436 A1 * 8/2002 Peng et al. ................. 310/328
2004/0155736 A1 * 8/2004 Song et al. .................... 335/78
2004/0183402 A1 * 9/2004 Mizuyama et al. ......... 310/328
2004/0201320 A1 * 10/2004 Carson et al. .............. 310/328
2005/0194867 A1 * 9/2005 Kawakubo et al. ......... 310/348
2005/0236935 A1 * 10/2005 Ohmori et al. ............. 310/328

OTHER PUBLICATIONS

Fox et al., "Development of micromachined RF switches with piezofilm actuation" Proceedings of the SPIE—The International Society for Optical Engineering SPIE-Int.Soc. Opt. Eng USA, vol. 4700, 2002, pp. 40-49, XP008058086 ISSN:0277-786X.

* cited by examiner

*Primary Examiner*—Thomas M. Dougherty
(74) *Attorney, Agent, or Firm*—Birch, Stewart, Kolasch & Birch, LLP

(57) ABSTRACT

A low voltage micro switch includes a substrate having an actuating space therein; an actuating unit having a piezo-electric material extended in a cantilever beam shape from a portion of the substrate to the actuating space of the substrate and a bias electrode; a conductive signal line extendedly formed at a certain interval from one side of the substrate and having a disconnected portion; a supporting unit connected to the actuating unit, positioned in the actuating space, and moving according to actuation of the actuating unit; a switching unit formed at the supporting unit and connecting or disconnecting the disconnected portion of the conductive signal line according to movement of the supporting unit; and one or more ground units formed at the substrate.

19 Claims, 7 Drawing Sheets

LOW VOLTAGE MICRO SWITCH

This Non-provisional application claims priority under 35 U.S.C. §119(a) on Patent Application No(s). 10-2003-0026466 filed in Korea on Apr. 25, 2003, the entire contents of which are hereby incorporated by reference.

BACKGROUND OF THE INVENTION

1. Field of the Invention

The present invention relates to a micro switch and, more particularly, to a low voltage micro switch capable of being driven at a low voltage, accurately controlling ON/OFF, and facilitating processes and integration with a circuit part.

2. Description of the Background Art

Electronic systems used at a high frequency band are becoming ultra-compact, ultra-light and better in performance. Accordingly, in the existing electronic system, researches are ongoing on a micro switch using a new technology called a micromachining as a substitute for a semiconductor switch such as an FET (Field Effect Transistor) or a pin diode.

The conventional semiconductor switches have problems in that their power loss is high, there is a distortion and nonlinearity, and ON/OFF insulation is not completely made.

Researches are widely ongoing toward implementing micro switches such as a MEMS switch or a tunable capacitor by employing an actuator which is fabricated by using the micromachining technology and has mechanical motion.

The micro switches can be applied to next-generation mobile communication terminals, personal digital assistance (PDA), wireless communication systems, phase shifters, antenna tuners, receivers, transmitters, phase arrayed smart antennas, satellite broadcasters, satellite communicators or the like, and as such it is highly expected to accomplish compact, light, high-performance and low-priced electronic systems.

Most of micro switches, such as the MEMS switches and the tunable capacitor, which have been developed and proposed to date employs the actuator operated by an electrostatic force or a magnetic force.

Even though the MEMS switch and the tunable capacitor driven by the electrostatic force have such a low power consumption as to be neglected, they are disadvantageous in terms of reliability that a stiction problem occurs due to charging and microwelding when they are driven.

Meanwhile, referring to the MEMS switch and the tunable capacitor driven by the magnetic force, even through they can be driven at a low voltage, their power consumption is quite high and their fabrication process is complicate, and in addition, because it is difficult to integrate them together with other integrated circuit device on a single chip, a size of a system can not be much reduced.

Therefore, a micro switch, that can be driven at a low voltage, have a high reliability and can be integrated together with other integrated circuit on a single substrate, is required.

SUMMARY OF THE INVENTION

Therefore, an object of the present invention is to provide a low voltage micro switch capable of being driven at a low voltage, accurately controlling ON/OFF, and facilitating processes and integration with a circuit part To achieve these and other advantages and in accordance with the purpose of the present invention, as embodied and broadly described herein, there is provided a low voltage micro switch including: a substrate having an actuating space formed by etching at a certain area therein; an actuating unit having a piezoelectric material extended in a cantilever beam shape from a portion of the substrate to the actuating space of the substrate and a bias electrode; a conductive signal line extendedly formed at a certain interval from one side of the substrate and having a disconnected portion; a supporting unit connected to the actuating unit, positioned in the actuating space, and moving according to actuation of the actuating unit; a switching unit formed at the supporting unit and connecting or disconnecting the disconnected portion of the conductive signal line according to movement of the supporting unit; and one or more ground units formed at the substrate.

To achieve the above object, there is also provided a low voltage micro switch including: a substrate having an actuating space formed by etching at a certain area therein; an actuating unit having a piezoelectric material extended in a cantilever beam shape from a portion of the substrate to the actuating space of the substrate and a bias electrode; a conductive signal line extendedly formed at a certain interval from one side of the substrate; a supporting unit connected to the actuating unit, having a connection electrode connected to the substrate, and moving according to actuation of the actuating unit in the actuating space; a capacitor unit formed on the connection electrode of the supporting unit and contacted to or separated from the conductive signal line according to movement of the supporting unit; and one or more ground units formed at the substrate.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
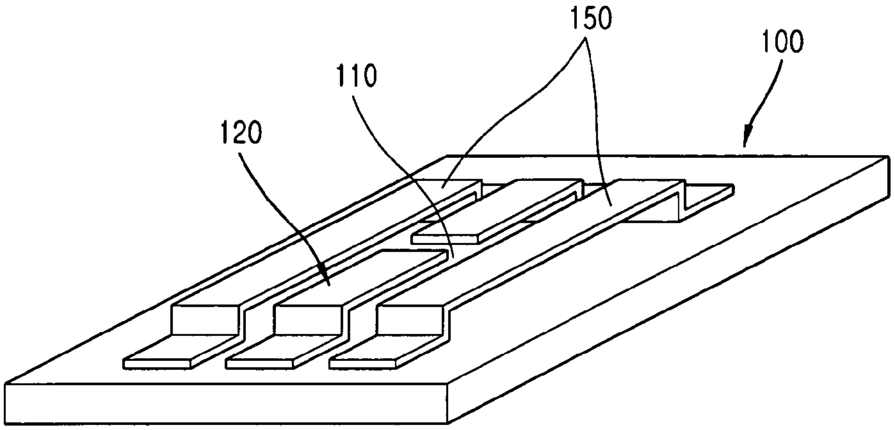
FIG. 1 is a perspective view showing one example of a low voltage micro switch in accordance with the present invention.
Figure 2:
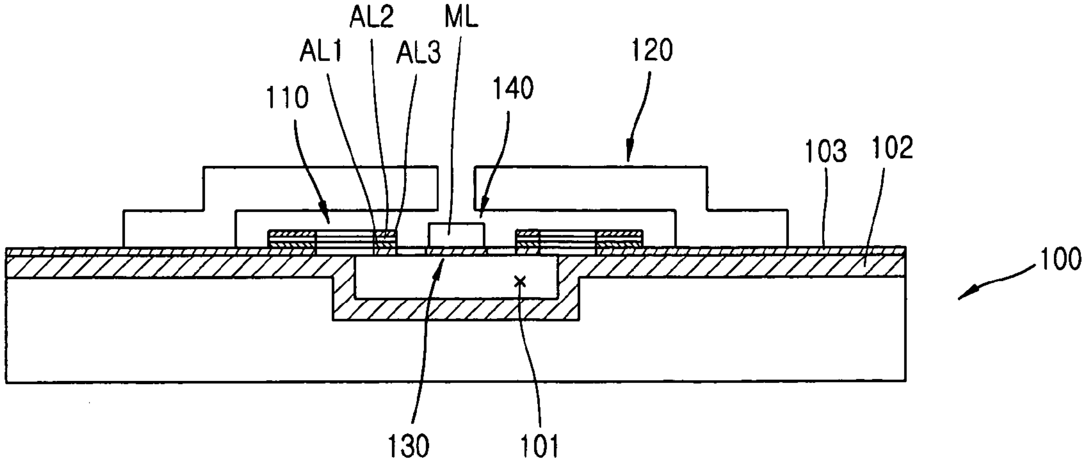
FIG. 2 is a front sectional view of the low voltage micro switch.

FIG. 1 is a perspective view showing one example of a low voltage micro switch in accordance with the present invention, and FIG. 2 is a front sectional view of the low voltage micro switch.

As shown, the low voltage micro switch includes: a low voltage micro switch including: a substrate 100 having an actuating space 101 therein; an actuating unit 110 having a piezoelectric material extended in a cantilever beam shape from a portion of the substrate 100 to the actuating space of the substrate and a bias electrode; a conductive signal line 120 extendedly formed at a certain interval from one side of the substrate 100 and having a disconnected portion; a supporting unit 130 connected to the actuating unit 110 and moving according to actuation of the actuating unit 110; a switching unit 140 formed at the supporting unit 130 and connecting or disconnecting the disconnected portion of the conductive signal line 120 according to movement of the supporting unit 130; and one or more ground units 150 formed at the substrate 100.

As for the substrate 100, the actuating space 101 having a certain area and depth is formed by etching a portion of silicon formed having a certain thickness and area, and a protection layer 102 is formed on the actuating space-formed silicon. An insulation layer 103 is formed on the protection layer 102. The insulation layer 103 can be formed directly on the silicon.

The actuating space 101 may be formed penetratingly at a portion of the substrate 100. The penetrating actuating space 101 is formed by a bulk micromachining technology.

The conductive signal line 120 has a certain thickness and length, both end portions of which are formed bent. The bent end portions of the conductive signal line 120 is integrally formed on the substrate 100 so as to be positioned at both sides of the actuating space 101, and a middle portion thereof maintains a certain interval (2~5 μm) with the substrate 100 and traverses the actuating space 101. The middle portion of the conductive signal line 120 becomes short.

Figure 3:
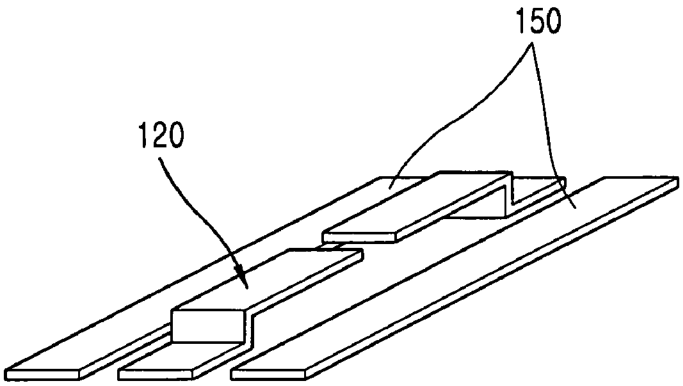
FIG. 3 is a perspective view showing another example of a ground unit constituting the low voltage micro switch.

The ground units 150 are formed to be positioned at both sides of the conductive signal line 120. The ground unit 150 is formed in the same shape as the conductive signal line 120. As a different embodiment of the ground unit 150, the ground unit 150 can be formed in a flat plate form having a certain thickness, width and length as shown in FIG. 3.

The conductive signal line 120 and the ground unit 150 are formed by electroplating, and made of a material such as Au, Cu, Ag, Ni or the like.

Figure 4:
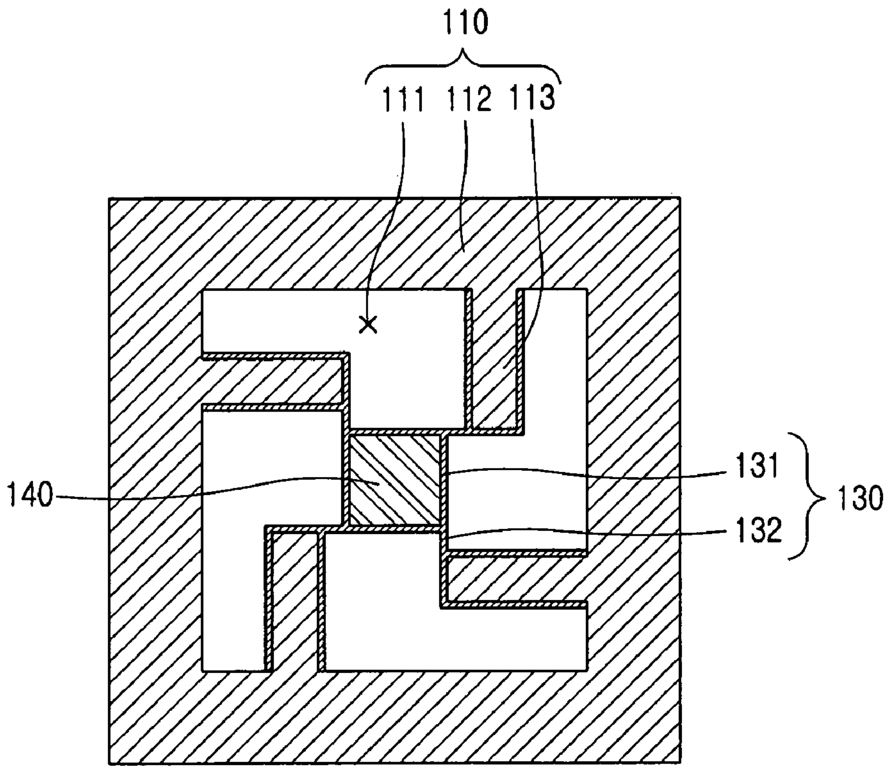
FIG. 4 is a plan view showing an actuating unit, a supporting unit and a switching unit of the low voltage micro switch.

As shown in FIG. 4, the actuating unit 110 includes a base portion 112 having a certain area and thickness and a rectangular through hole 111 and four cantilever portions 113 extendedly formed at certain intervals at an inner edge of the base portion 112. The cantilever portion has a certain width and length.

The actuating unit 110 adopts a principle of a piezoelectric actuator and includes a first electrode layer AL1 formed on the insulation layer 103, a piezoelectric material layer AL2 formed of a piezoelectric material on the first electrode layer AL1, and a second electrode layer AL3 formed on the piezoelectric material layer AL2.

The first and second electrode layers AL1 and AL3 are bias electrode layers to which a DC bias voltage is supplied. The first electrode 4 layer AL1 can be made of Tl/Pt and the second electrode layer AL3 is made of Pt or $RuO_2$. The piezoelectric material is much contracted and expanded according to the DC bias voltage. As the piezoelectric material, PZT (Pt-Zirconium-Titanium) or PLZT (La-coated PZT) or the like is used.

When a bias voltage 1V is applied to the PZT or the PLZT material, the actuating unit is moved by 1 μm. Thus, in order to move the actuating unit 110 by as long as 2~5 μm, a bias voltage of less than 5V should be supplied.

The supporting unit 130 includes a rectangular thin plate portion 131 forming the switching unit 140 and four connection portions 132 connecting the plate portion 131 and four cantilever portions. The supporting unit 130 is formed as an insulation layer 103 and positioned in the actuating space 101 of the substrate 100.

The switching unit 140 is formed as a metallic film on the plate portion 131 of the supporting unit 130, and as the metallic film, a conductor metal is used.

The above-described configuration is formed by the MEMS technology, and its schematic process will be described as follows.

The actuating space 101 is formed by etching on the silicon plate, on which the protection layer 102 is formed. A sacrificial layer (not shown) is formed and smoothed on the actuating space 101, on which the insulation layer 103 is formed to form the actuating unit 110 and the supporting unit 130.

The insulation layer 103 is patterned to form an outer appearance of the actuating unit 110 and the supporting unit 130.

The first electrode layer AL1, the piezoelectric material layer AL2 and the second electrode layer AL3 are formed on the patterned insulation layer 103 to form the actuating unit 110.

A metallic layer (ML) is formed on the insulation layer 103 corresponding to the plate portion 131 of the supporting unit 130, and the metallic layer ML forms the switching unit 140.

An insulation sacrificial layer (not shown) is formed at the entire surface of the substrate 100, on which the actuating unit 110 and the supporting unit 130 have been formed, and then, patterned, and the conductive layer is formed by electroplating. The conductive layer is patterned and the conductive signal line 120 is formed thereon.

Thereafter, the sacrificial layers are all removed to form the actuating unit 110, the supporting unit 130 and the conductive signal line 120 with a disconnected portion. The conductive signal line 120 has a bent form and distanced at a certain interval from the substrate 100.

Figure 5:
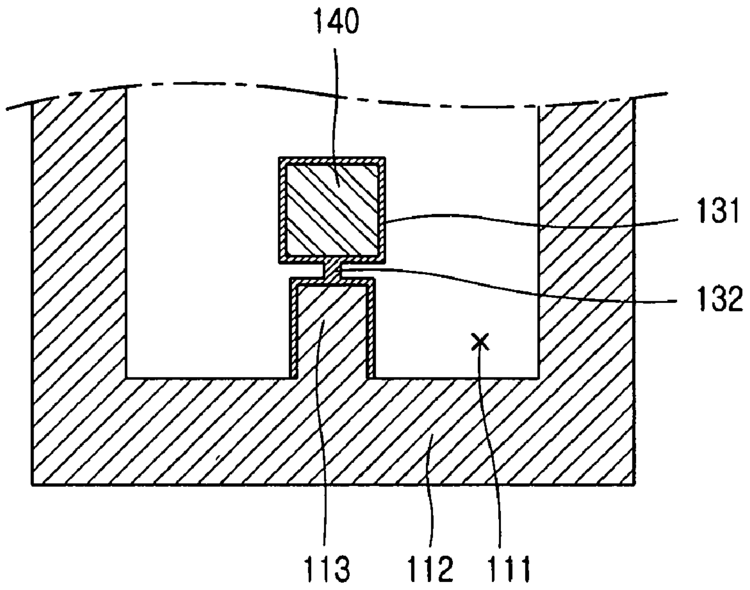
FIGS. 5 through 9 are plan views showing various examples of the actuating unit, the supporting unit and the switching unit of the low voltage micro switch.

In a different embodiment of the actuating unit 110 and the supporting unit 130, as shown in FIG. 5, the actuating unit 110 includes the base portion 112 having the through hole 111 therein and one cantilever portion 113 formed extended with a certain length from an inner edge of the base portion 112.

The supporting unit 130 includes the plate portion 131 forming the switching unit 140 and one connection portion 132 connecting the plate portion 131 and the cantilever portion 113.

The supporting unit 130 is the insulation layer 103 formed on the actuating space 101 of the substrate 100.

Figure 6:
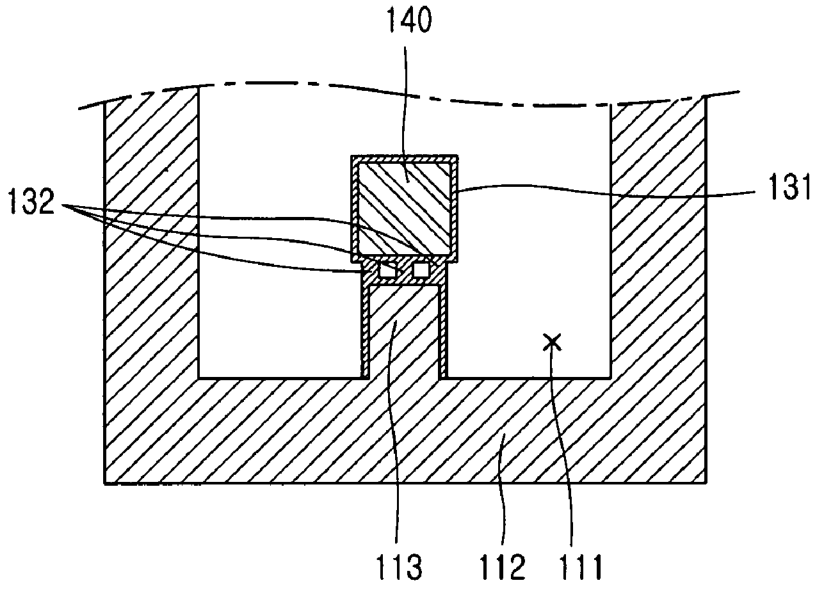

As shown in FIG. 6, there can be three connection portions 132, and two or three or more connection portions can be formed.

Figure 7:
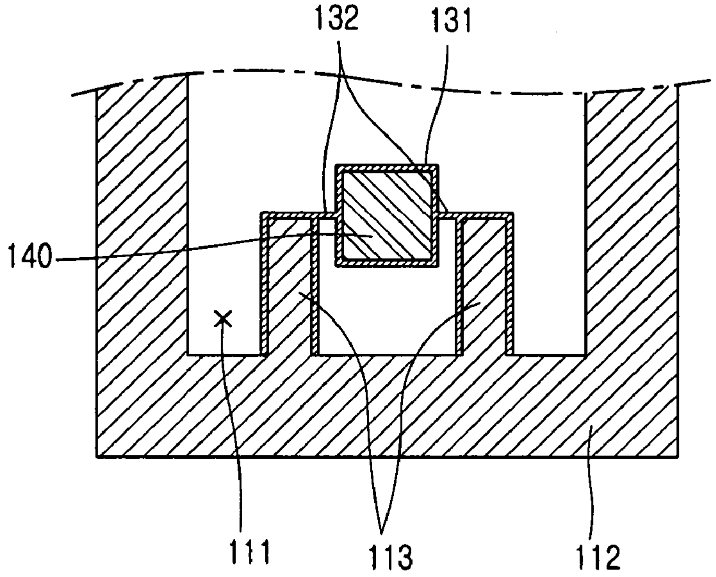

In a still different embodiment of the actuating unit 110 and the supporting unit 130, as shown in FIG. 7, the actuating unit 110 includes a base portion 112 having a through hole 111 therein and two cantilever portions 113 formed extended with a certain length at a certain interval from an inner edge of the base portion 112.

Figure 8:
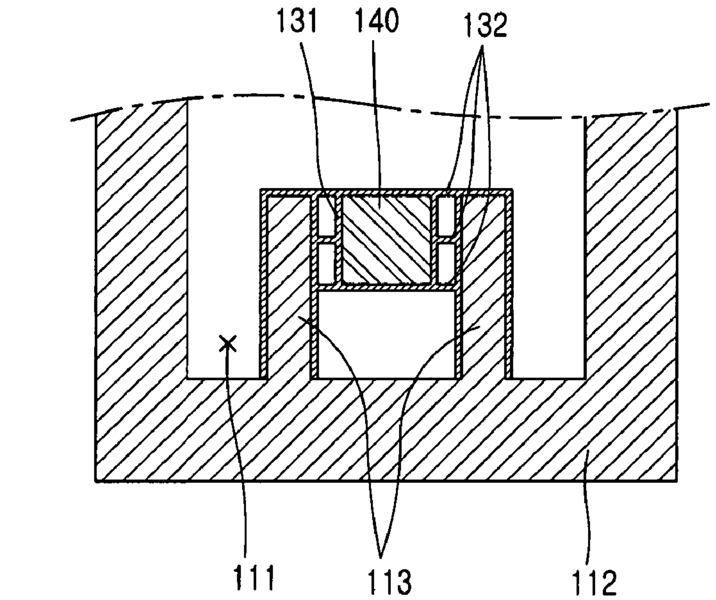

The supporting unit 130 is positioned between the two cantilever portions 113, and includes a plate portion 131 forming the switching unit 140 and two connection portions 132 connecting the plate portion 132 and the two cantilever portions 113. The supporting unit 130 is an insulation layer and positioned on the actuating space 101 of the substrate 100. As shown in FIG. 8, there can be six connection portions 132.

Figure 9:
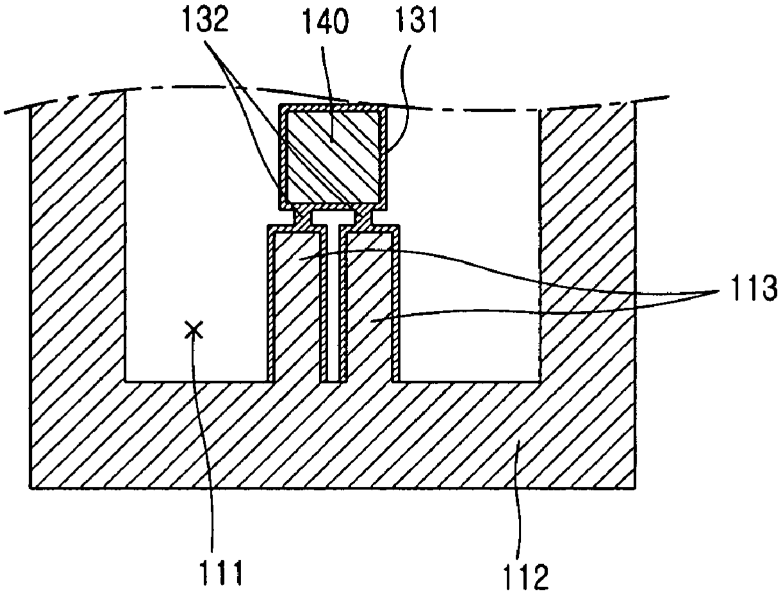

In a yet different embodiment of the actuating unit 110 and the supporting unit 130, as shown in FIG. 9, the actuating unit 110 includes a base portion 112 having a through hole 111 therein and two cantilever portions 113 formed extended at a certain interval from an inner edge of the base portion 112. And, the supporting unit 130 includes a plate portion 131 forming the switching unit 140 and is a connection portion 132 connecting one side of the plate portion 131 and the cantilever portions 113. The supporting unit 130 is formed as an insulation layer 103 and positioned inside the actuating space 101 of the substrate 100.

As mentioned above, in the low voltage micro switch, when a low voltage is applied to the first and second electrode layers AL1 and AL3, the bias electrodes constituting the actuating unit 110, the piezoelectric material layer AL2 is contracted and expanded. According to the contraction and expansion of the piezoelectric material layer AL2, the supporting unit 130 connected to the actuating unit 110 is moved in a vertical direction (on the drawing) and vibrated.

As the supporting unit 130 is vibrated up and down, the switching unit 140 formed at the supporting unit 130 is also moved up and down and repeatedly comes in contact to and is separated from the disconnected portion of the conductive signal line 120 positioned on the switching unit 140.

In this manner, the switching unit 140 switches a signal flowing at the conductive signal line 120 by connecting or disconnecting the disconnected portion of the conductive signal line 120. In the process, when the supporting unit 130 including the plate portion 131 and the connection portion 132 is moved up and down, the plate portion 31 maintains a horizontal state by the bending deformation of the connection portion 132, thereby improving reliability in that the switching unit 140 formed by the plate portion 131 contacts with the conductive signal line 120.

Figure 10:
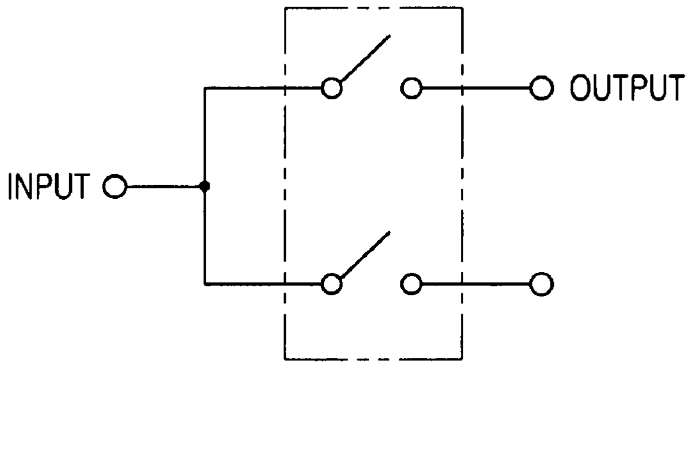
FIGS. 10 to 12 show interconnections (circuit diagrams of types of general micro switches.
Figure 11:
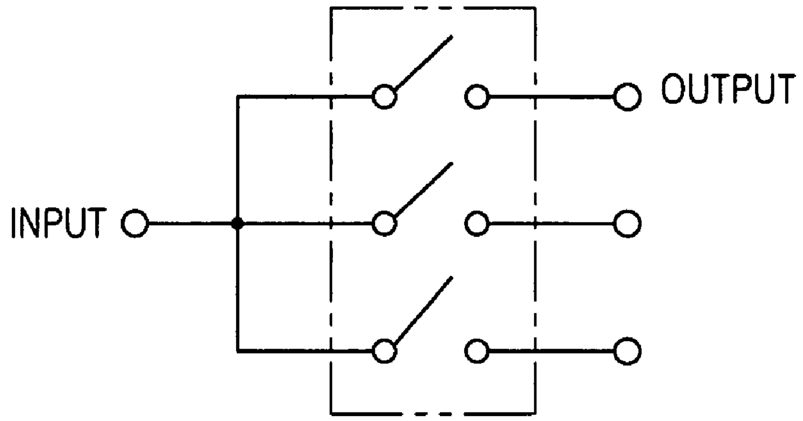
Figure 12:
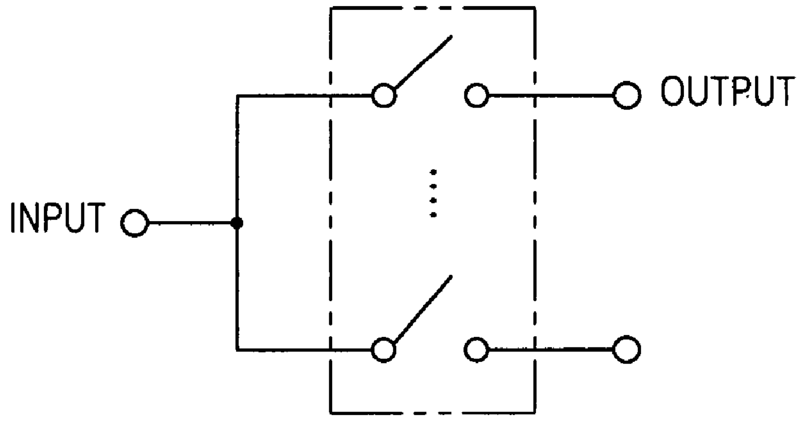

The low voltage micro switch can be implemented in various types such as an SPDP (Single Pole Double Through) as shown in FIG. 10, an SP3T (Single Pole Three Through) as shown in FIG. 11, and an SPNT (Single Pole N Through) as shown in FIG. 12. The low voltage micro switch is actuated at a low voltage.

Figure 13:
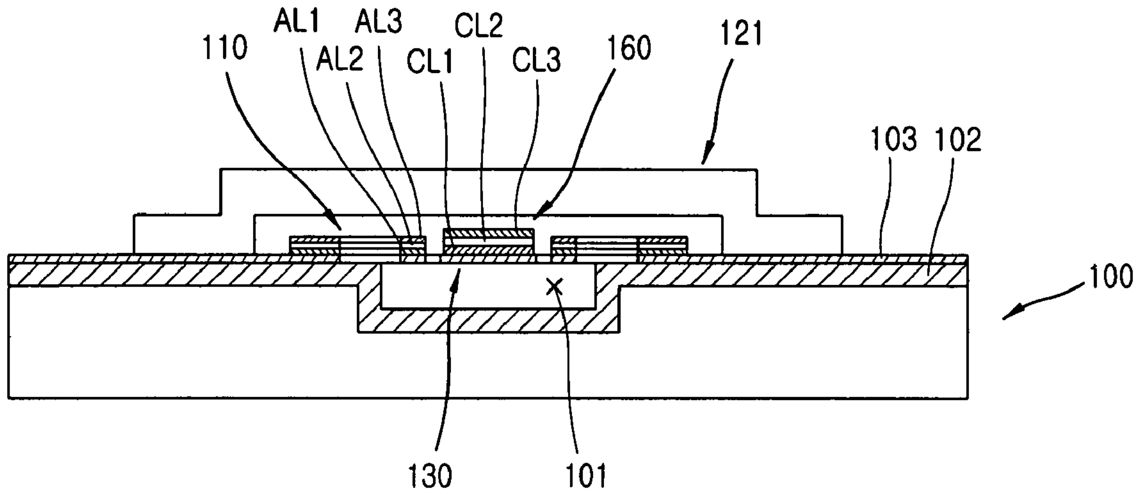
FIG. 13 is a front sectional view showing another example of the low voltage micro switch in accordance with the present invention.

FIG. 13 is a front sectional view showing another example of the low voltage micro switch in accordance with the present invention.

As shown in FIG. 13, the low voltage micro switch including: a substrate 100 having an actuating space 101 therein; an actuating unit 110 having a piezoelectric material extended in a cantilever beam shape from a portion of the substrate 100 to the actuating space 101 of the substrate and a bias electrode; a conductive signal line 121 extendedly formed at a certain interval from one side of the substrate 100; a supporting unit 130 connected to the actuating unit 110, having a connection electrode (not shown) connected to the substrate 100, and moving according to actuation of the actuating unit 110 in the actuating space 101; a capacitor unit 160 formed on the connection electrode of the supporting unit 130 and contacted to or separated from the conductive signal line 121 according to movement of the supporting unit 130; and one or more ground units 150 formed at the substrate 100.

The substrate 100, the actuating unit 110 and the ground unit 150 have the same construction as the substrate 100, the actuating unit 110 and the ground unit 150 of the first embodiment as described above.

The conductive signal line 121 has a certain thickness, width and length, and both end portions thereof are bent. The bent portion is integrally formed with the substrate 100, and a portion positioned between the bent portions maintains a certain interval (isolation) with the substrate 100. Namely, the conductive signal line 121 does not have a disconnected portion.

The supporting unit 130 includes a connection electrode (not shown) therein, and its outer appearance has the same shape as the supporting unit of the low voltage micro switch of the first embodiment.

The capacitor unit 160 includes a first metallic layer CL1 formed at an upper portion of the connection electrode of the support unit 130, a dielectric layer CL2 formed on the first metallic layer CL1 and a second metallic layer CL3 formed on the dielectric layer CL2. The capacitor unit 160 is formed at a plate portion 131 of the supporting unit 130.

Figure 14:
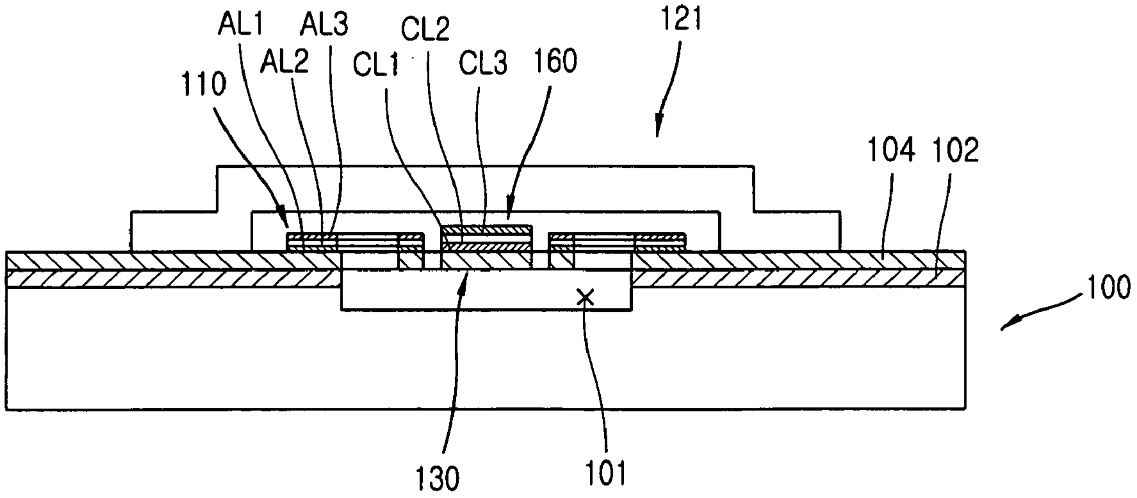
FIG. 14 is a front sectional view showing still another example of the low voltage micro switch in accordance with the present invention.

In a different embodiment of the capacitor unit 160, as shown in FIG. 14, a high resistance silicon layer 104 having a connection electrode, instead of the insulation layer 103, is formed on a protection layer 102, and the first metallic layer CL1, the dielectric layer CL2 and the second metallic layer CL3 are formed on the high resistance silicon layer 104.

In the low voltage micro switch, when a low voltage is applied to the first and second electrode layers AL1 and AL3, the bias electrodes constituting the actuating unit 110, the piezoelectric material layer AL2 is contracted and expanded.

According to the contraction and expansion of the piezoelectric material layer AL2, the supporting unit 130 connected to the actuating unit 110 is moved in a vertical direction (on the drawing) and vibrated.

As the supporting unit 130 is moved up and down, the capacitor unit 160 formed at the supporting unit 130 is also moved up and down and repeatedly comes in contact with and is separated from the conductive signal line 120 positioned on the capacitor unit 160. In this manner, when the capacitor 160 is in contact with the conductive signal line or separated from the conductive signal line, impedance flowing at the conductive line is controlled.

In the process, when the supporting unit 130 including the plate portion 131 and the connection portion 132 is moved up and down, the plate portion 131 maintains a horizontal state by the bending deformation of the connection portion 132, thereby improving reliability in that the capacitor unit 160 formed by the plate portion 131 contacts with the conductive signal line 120.

The low voltage micro switch can be implemented as various types of switches, and driven at a low voltage (at or below 5V).

As so far described, the low voltage micro switch in accordance with the present invention has the following advantages.

That is, for example, the resistance type or capacitance type micro switch driven at a low voltage can be easily implemented by using a MEMS technology, and since a supplementary circuit part can be integrated on the same substrate 100, integration can be easy and the size of an applied product can be reduced.

In addition, since the micro switch can be driven at a low voltage, there is no charge accumulation according to driving, so a stiction problem can be prevented and thus reliability can be improved.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A low voltage micro switch comprising:

a substrate having an actuating space formed by etching at a certain area therein;

an actuating unit having a piezoelectric material extended in a cantilever beam shape from a portion of the substrate to the actuating space of the substrate and a bias electrode;

a conductive signal line extendedly formed at a certain interval from one side of the substrate and having a disconnected portion;

a switching unit formed at a supporting unit and connecting or disconnecting the disconnected portion of the conductive signal line according to the movement of the actuating unit;

said supporting unit connected to the actuating unit and the switching unit, positioned in the actuating space, including a plate portion forming the switching unit and the connection portions connecting the plate portion and a cantilever of the actuating unit, and moving according to the actuation of the actuating unit; and one or more ground units formed at the substrate.

2. The switch of claim 1, wherein the actuating space has a groove form with a certain depth in a portion of the substrate.

3. The switch of claim 1, wherein the actuating space is formed penetratingly in a portion of the substrate.

4. The switch of claim 1, wherein the switching unit is made of a conductor material.

5. The switch of claim 1, wherein the actuating unit includes four cantilever portions formed at certain intervals, and the supporting unit includes four connection portions connecting the plate portion and the four cantilever portions.

6. The switch of claim 1, wherein the actuating unit has one cantilever portion having a certain length, and the supporting unit includes a plate portion forming the switching unit and a connection portion connecting the plate portion and the cantilever portion.

7. The switch of claim 6, wherein there are two or three connection portions.

8. The switch of claim 1, wherein the actuating unit includes two cantilever portion formed at a certain interval, and the supporting unit includes a plate portion positioned between the two cantilever portions and forming the switching unit and a connection portion connecting the plate portion and the two cantilever portions.

9. The switch of claim 8, wherein there are two or more connection portions connecting the plate portion and the cantilever portions.

10. The switch of claim 1, wherein the actuating unit includes two cantilever portions formed at a certain interval, and the supporting unit includes a plate portion forming the switching unit and a connection portion connecting one side of the plate portion and the cantilever portions.

11. A low voltage micro switch comprising:

a substrate having an actuating space formed by etching at a certain area therein;

an actuating unit having a piezoelectric material extended in a cantilever beam shape from a portion of the substrate to the actuating space of the substrate and a bias electrode;

a conductive signal line extendedly formed at a certain interval from one side of the substrate;

a supporting unit connected to the actuating unit, having a connection electrode connected to the substrate, and moving according to actuation of the actuating unit in the actuating space;

a capacitor unit formed on the connection electrode of the supporting unit and contacted to or separated from the conductive signal line according to movement of the supporting unit; and one or more ground units formed at the substrate.

12. The switch of claim 11, wherein the actuating unit includes four cantilever portions formed at certain intervals, and the supporting unit includes a plate portion forming the capacitor unit and four connection portions connecting the plate portion and four cantilever portions.

13. The switch of claim 11, wherein the actuating unit has one cantilever portion having a certain length, and the supporting unit includes a plate portion forming the capacitor unit and a connection portion connecting the plate portion and the cantilever portion.

14. The switch of claim 13, wherein there are two or three connection portions.

15. The switch of claim 11, wherein the actuating unit includes two cantilever portion formed at a certain interval, and the supporting unit includes a plate portion positioned between the two cantilever portions and forming the capacitor unit and a connection portion connecting the plate portion and the two cantilever portions.

16. The switch of claim 15, wherein there are two or more connection portions connecting the plate portion and the cantilever portions.

17. The switch of claim 11, wherein the actuating unit includes two cantilever portions formed at a certain interval, and the supporting unit includes a plate portion forming the capacitor unit and a connection portion connecting one side of the plate portion and the cantilever portions.

18. The switch of claim 11, wherein the capacitor unit comprises:

a first metallic layer formed at an upper portion of the connection electrode of the supporting unit;

a dielectric layer formed on the first metallic layer; and a second metallic layer formed on the dielectric layer.

19. The switch of claim 18, wherein the supporting unit is formed as a high resistance silicon layer.

* * * * *